US008581417B2

(12) United States Patent
Hasegawa et al.

(10) Patent No.: US 8,581,417 B2
(45) Date of Patent: Nov. 12, 2013

(54) SEMICONDUCTOR DEVICE STACK WITH BONDING LAYER AND WIRE RETAINING MEMBER

(75) Inventors: Yu Hasegawa, Tokyo (JP); Mitsuaki Katagiri, Tokyo (JP); Satoshi Isa, Tokyo (JP); Ken Iwakura, Tokyo (JP); Dai Sasaki, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 351 days.

(21) Appl. No.: 12/687,311

(22) Filed: Jan. 14, 2010

(65) Prior Publication Data

US 2010/0193933 A1 Aug. 5, 2010

(30) Foreign Application Priority Data

Jan. 30, 2009 (JP) .................................. 2009-019564
Nov. 27, 2009 (JP) .................................. 2009-270146

(51) Int. Cl.
*H01L 23/02* (2006.01)
*H01L 23/48* (2006.01)
*H01L 23/52* (2006.01)
*H01L 29/40* (2006.01)

(52) U.S. Cl.
USPC .... 257/777; 257/686; 257/784; 257/E23.025; 257/E23.085; 257/E25.006

(58) Field of Classification Search
USPC .......... 257/686, 777, 784, E23.024, E23.025, 257/E23.033, E23.068, E23.141, E25.006, 257/E25.013, E25.018, E25.021, E25.027, 257/E23.085
See application file for complete search history.

(56) References Cited

U.S. PATENT DOCUMENTS

| 7,298,032 | B2 | 11/2007 | Kim et al. | |
|---|---|---|---|---|
| 2004/0113256 | A1* | 6/2004 | Thomas et al. | 257/686 |
| 2004/0113280 | A1* | 6/2004 | Kim | 257/777 |
| 2004/0201088 | A1* | 10/2004 | Kim et al. | 257/686 |
| 2007/0194415 | A1* | 8/2007 | Seng et al. | 257/678 |
| 2008/0122114 | A1* | 5/2008 | Lu et al. | 257/777 |
| 2008/0197509 | A1 | 8/2008 | Yamaguchi et al. | |
| 2010/0270688 | A1* | 10/2010 | Su et al. | 257/777 |

FOREIGN PATENT DOCUMENTS

| JP | 11-135539 A | 5/1999 |
|---|---|---|
| JP | 2004-312008 A | 11/2004 |
| JP | 2008-198909 A | 8/2008 |

\* cited by examiner

*Primary Examiner* — Teresa M Arroyo
(74) *Attorney, Agent, or Firm* — Foley & Lardner LLP

(57) ABSTRACT

In a semiconductor device of the present invention, a second semiconductor chip is stacked on a first semiconductor chip having a plurality of bonding pads in its central region, with a bonding layer interposed therebetween. A plurality of wires respectively connected to the plurality of bonding pads of the first semiconductor chip are led out to the outside over a peripheral edge of the first semiconductor chip by passing through a space between the first and second semiconductor chips. A retaining member for retaining at least a subset of the plurality of wires is provided in a region on the first semiconductor chip including a middle point between the bonding pads and the peripheral edge of the first semiconductor chip by using a material different from the bonding layer so that the subset of the wires is positioned generally at a center of the spacing between the first semiconductor chip and the second semiconductor chip.

19 Claims, 8 Drawing Sheets

SEMICONDUCTOR DEVICE STACK WITH BONDING LAYER AND WIRE RETAINING MEMBER

This application is based upon and claims the benefit of priority from Japanese patent application No. 2009-019564, filed on Jan. 30, 2009 and Japanese patent application No. 2009-270146, filed on Nov. 27, 2009, the disclosure of which are incorporated herein in its entirety by reference.

BACKGROUND OF THE INVENTION

1. Field of the Invention

The present invention relates to a semiconductor device having a plurality of stacked semiconductor chips and a method of manufacturing the semiconductor device.

2. Description of the Related Art

In recent years, a multiple chip package (MCP) in which a plurality of semiconductor chips are stacked has attracted attention as a technique to reduce the package area while reducing the manufacturing cost. An MCP in which two semiconductor chips are stacked will be described by way of example. First, the first semiconductor chip is mounted on a package substrate, and electrodes of this semiconductor chip and electrodes on the package substrate are connected to each other by wires. The second semiconductor chip is thereafter mounted on the first semiconductor chip with an adhesive, and electrodes of the second semiconductor chip and electrodes on the package substrate are connected to each other by wires.

With the MCP, there is a problem of contact between wires that led out from the electrodes of the semiconductor chip on the lower layer side and the surface of this semiconductor chip.

Japanese Patent Laid-Open Nos. 2004-312008, 2008-198909 and 11-135539 disclose means for preventing such an undesirable contact.

According to Japanese Patent Laid-Open No. 2004-312008, an insulating supporting structure is provided on the periphery of the semiconductor chip on the lower layer side to prevent undesirable contact between wires and the semiconductor chip.

According to Japanese Patent Laid-Open No. 2008-198909, wires from the semiconductor chip on the lower layer side are embedded in a resin interposed between the semiconductor chips in the upper and lower layers.

According to Japanese Patent Laid-Open No. 11-135539, wires are sandwiched in a two-layer polyimide tape in a structure that is different from the MCP structure.

Recent semiconductor devices are operated at higher speeds and there is a demand for minimizing parasite capacitance of the wire or the like. In particular, MCPs such as those described above are of such a construction that the parasitic capacitance of the wires from the semiconductor chip on the lower layer side can be increased due to passage of the wires between the two semiconductor chips. However, any of Japanese Patent Laid-Open Nos. 2004-312008, 2008-198909 and 11-135539 is not concerned with this point.

SUMMARY

In one embodiment, there is provided a semiconductor device that includes elements as described below. In the semiconductor device, a second semiconductor chip is stacked on a first semiconductor chip having a plurality of bonding pads (i.e., electrodes) in its central region, with a bonding layer interposed therebetween. A plurality of wires respectively connected to the plurality of bonding pads of the first semiconductor chip are led out to the outside over a peripheral edge of the first semiconductor chip by passing through a space between the first and second semiconductor chips. Further, a retaining member for retaining at least a subset of the plurality of wires is provided in a region on the first semiconductor chip including a middle point between the bonding pads and the peripheral edge of the first semiconductor chip by using a material different from the bonding layer so that the subset of the wires is positioned generally at a center of the spacing between the first semiconductor chip and the second semiconductor chip.

That is, the inventors of the present invention have found that an increase in parasitic capacitance of wires that pass through the space between the first and second semiconductor chips can be limited by positioning the wires generally at the center of the spacing between the first semiconductor chip and the second semiconductor chip in a region including a middle point between bonding pads and a peripheral edge of the first semiconductor chip. In the one embodiment, on the basis of this finding, the wire retaining member, to achieve this effects, is provided on the first semiconductor chip. According to the embodiment, a semiconductor device can be provided in which the parasitic capacitances of the bonding wires from the first semiconductor chip with respect to the upper and lower semiconductor chips are reduced to improve a signal characteristic.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Figure 1:
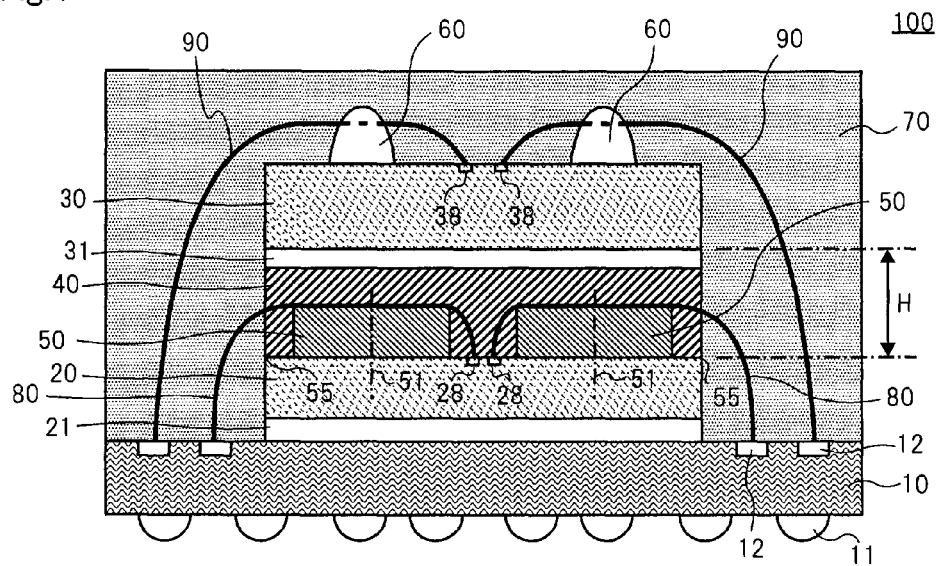
FIG. 1 is a side sectional view of a semiconductor device according to a first embodiment of the present invention.
Figure 2:
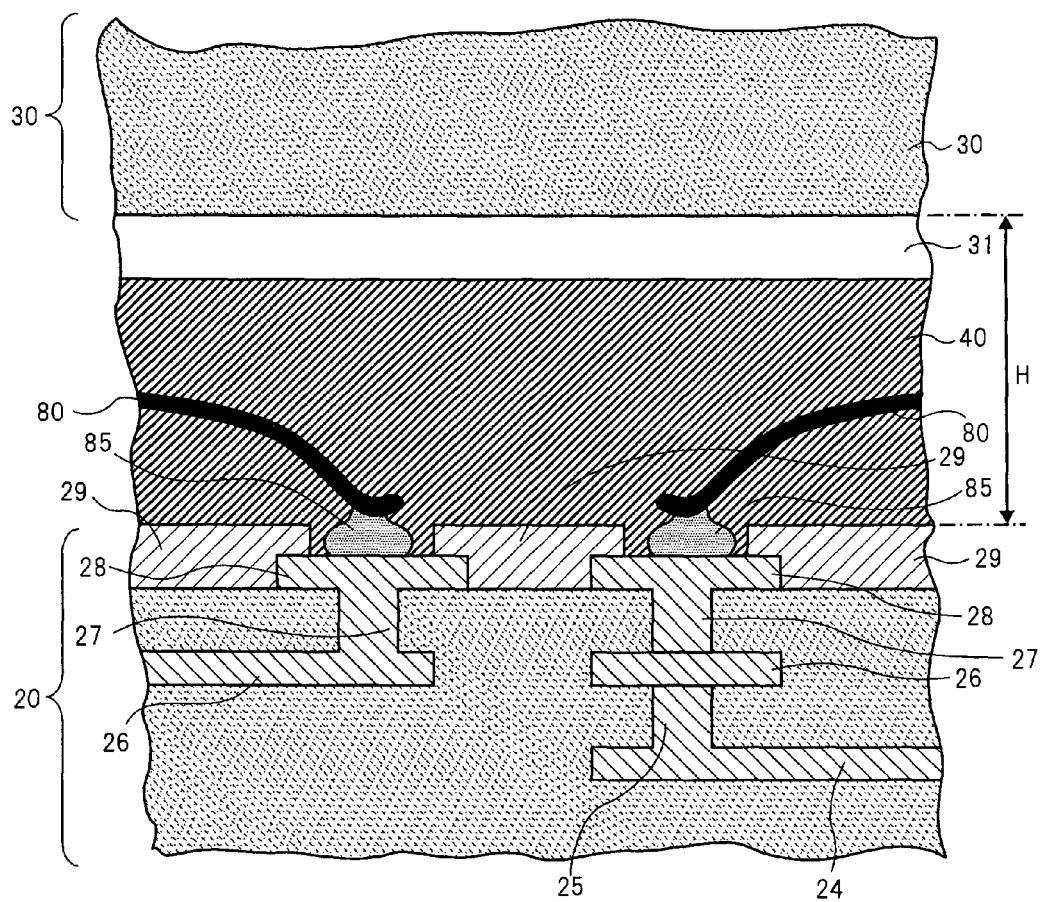
FIG. 2 is an enlarged sectional view of a bonding pad peripheral portion of the semiconductor chip on the lower layer side shown in FIG. 1.
Figure 3:
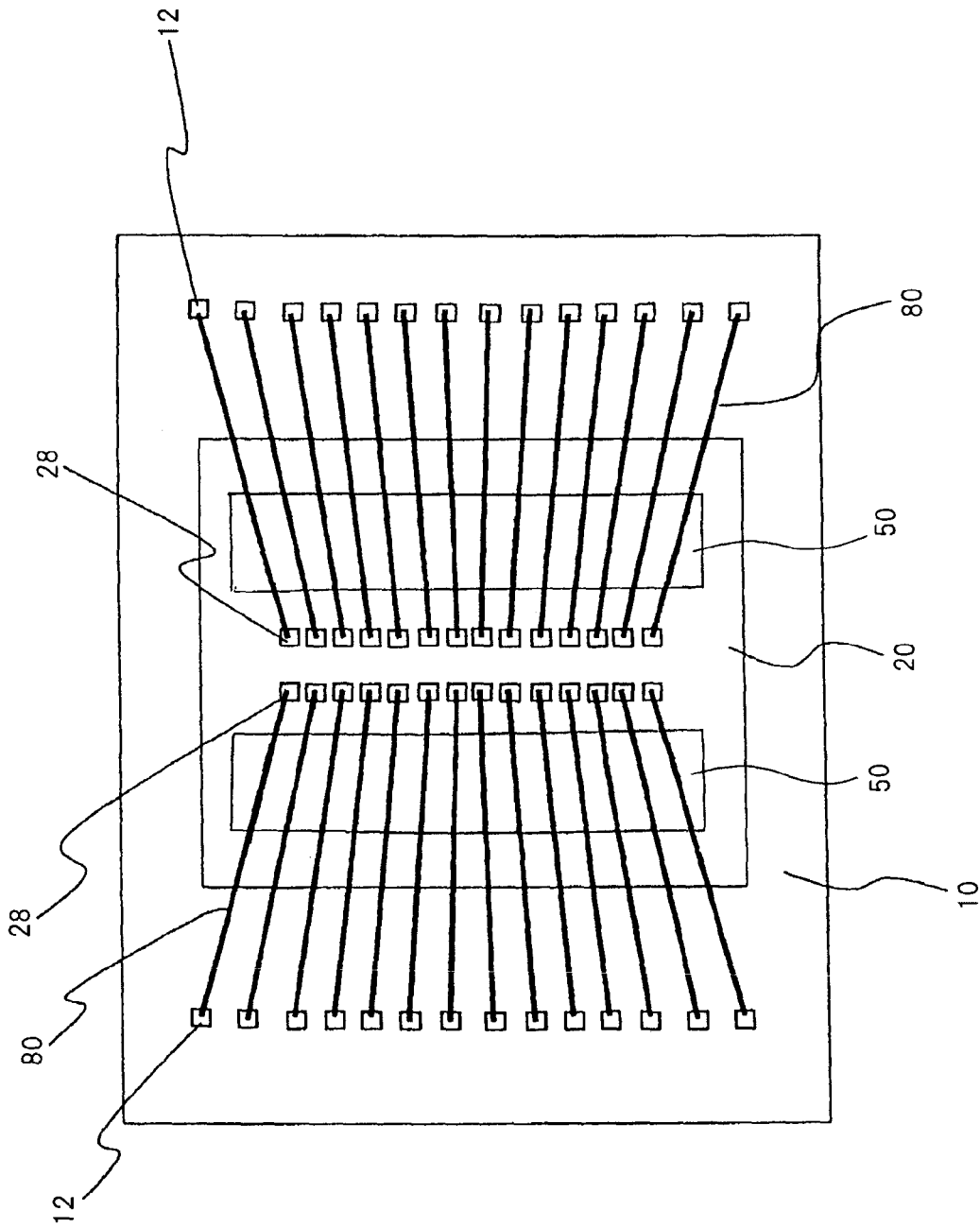
FIG. 3 is a plan view in a state where the semiconductor chip on the upper layer side shown in FIG. 1 is removed.

Referring to FIG. 1, a semiconductor device according to a first exemplary embodiment of the present invention is illustrated as an MCP having two stacked semiconductor chips 20 and 30 (hereinafter referred to simply as "chip"). In the present exemplary embodiment, in particular, each of chips 20 and 30 is a DRAM chip. Chip 20 on the lower layer side is mounted on package substrate 10 with die attached film (DAF) 21. As shown in FIG. 3, chip 20 has bonding pads (electrodes) 28 arranged in two rows in its central region. Each bonding pad 28 is connected to one end of corresponding wire 80. The other end of wire 80 is connected to an upper surface of corresponding electrode 12 on package substrate 10. Bump electrodes 11 for mounting and connecting on a mother board such as a printed circuit board are provided on the back surface of package substrate 10.

A pair of retaining members 50 are formed on chip 20 according to one of the features of the present invention, and wires 80 are bonded so as to pass over retaining members 50 as shown in FIG. 3. Each retaining member 50 is formed of a resin tape and is provided over a region including middle point 51 between bonding pads 28 of chip 20 and peripheral edge 55. This is because the amount of deflection of wires 80 is maximized at about middle point 51, and because reducing the parasitic capacitance or the like of wires 80 requires positioning wires 80 generally at the center of the spacing between two chips 20 and 30. It is, therefore, preferable to cover the front surface of chip 20 with retaining members 50 as much as possible. However, a smaller size of retaining member 50 may suffice as long as retaining member 50 covers a region including middle point 51. Briefly speaking, the size of retaining member 50 may be determined depending on the ease of manufacture or the like. Also, retaining members 50 may be provided by being divided so that wires 80 are positioned generally at the center of the spacing between chips 20 and 30 in regions including middle points 51 instead of providing retaining members 50 so as to cover regions including middle points 51.

While use of a resin tape as retaining member 50 has been described, retaining member 50 may be formed by application and setting of a resin paste material. That is, resin-based retaining member 50 may be formed by application of a paste material or by attaching a material in film form.

Since wires 80 are positioned generally at the center of the spacing between two chips 20 and 30, the height of retaining members 50 is set generally equal to the half of spacing H between chips 20 and 30. As shown in an enlarged state with respect to a portion including bonding pads 28 of chip 20, chip 20, as well as chip 30, has its surface covered with passivation film 29 having openings through which bonding pads 28 are exposed. Therefore spacing H is the distance from the surface of passivation film 29 to the back surface of the semiconductor substrate (silicon substrate) of chip 30 on the upper layer side. Wires 80 are bonded to exposed surfaces of bonding pads 28. In the present exemplary embodiment, a reverse bonding method is used. That is, gold pieces 85 are provided in advance on bonding pads of chip 20 by using tip portions of gold wires provided as bonding wires. Wires 80 are first bonded to electrodes 12 on package substrate 10. Wires 80 are thereafter extended over retaining members 50, bonded to gold pieces 85 and cut. The distance between retaining members 50 and bonding pads 28 or electrodes 20 can be set smaller in this way. A reduction in area is also achieved. The reverse bonding method is also used for wire bonding to chip 30 on the upper layer side.

Chip 20 is of a multilayer wiring structure and has wiring 24 and 26 in a plurality of layers and vias 25 and 27 for connection between wirings 24 and 26 and bonding pads 28. Each via is formed by filling a via hole with a metal or the like.

Referring back to FIG. 1, it is not necessary to perform bonding of wires 80 so that wires 80 are in contact with retaining members 50. This is because wires 80 are eventually brought into contact with retaining members 50 due to a load when chip 30 is stacked on chip 20.

That is, DAF 31 is provided on the back surface of chip 30; film over wire (FOW) 40 made of resin is applied on DAF 31; and chip 30 is stacked on chip 20 so that the gap between retaining members 50 is filled with FOW 40. At this time, the thicknesses of FOW 40 and DAF 31 are adjusted so that the sum of the thickness of FOW 40 and the thickness of DAF 31 is substantially equal to the thickness (height) of retaining members 50. As a result, wires 80 are brought into contact with retaining members 50. Wires 80 can be positioned generally at the center between two chips 20 and 30. Each of retaining members 50 and FOW 40 is a resin in a broad sense, but the materials of regaining members 50 and FOW 40 are different from each other.

Retaining members 60 for retaining wires 90 are provided on chip 30 on the upper layer side in the same way. The material of retaining members 60 is applied in a molten state from above wires 90 after bonding pads 38 of chip 30 and electrodes 12 on the package substrate have been connected by wires 90. The material is set after being applied. Wires 90 are thereby fixed and retained, with their portions embedded in retaining members 60.

Finally, a resin mold 70 is formed around two stacked chips 20 and 30, thereby completing semiconductor device 100 as an MCP.

Figure 4:
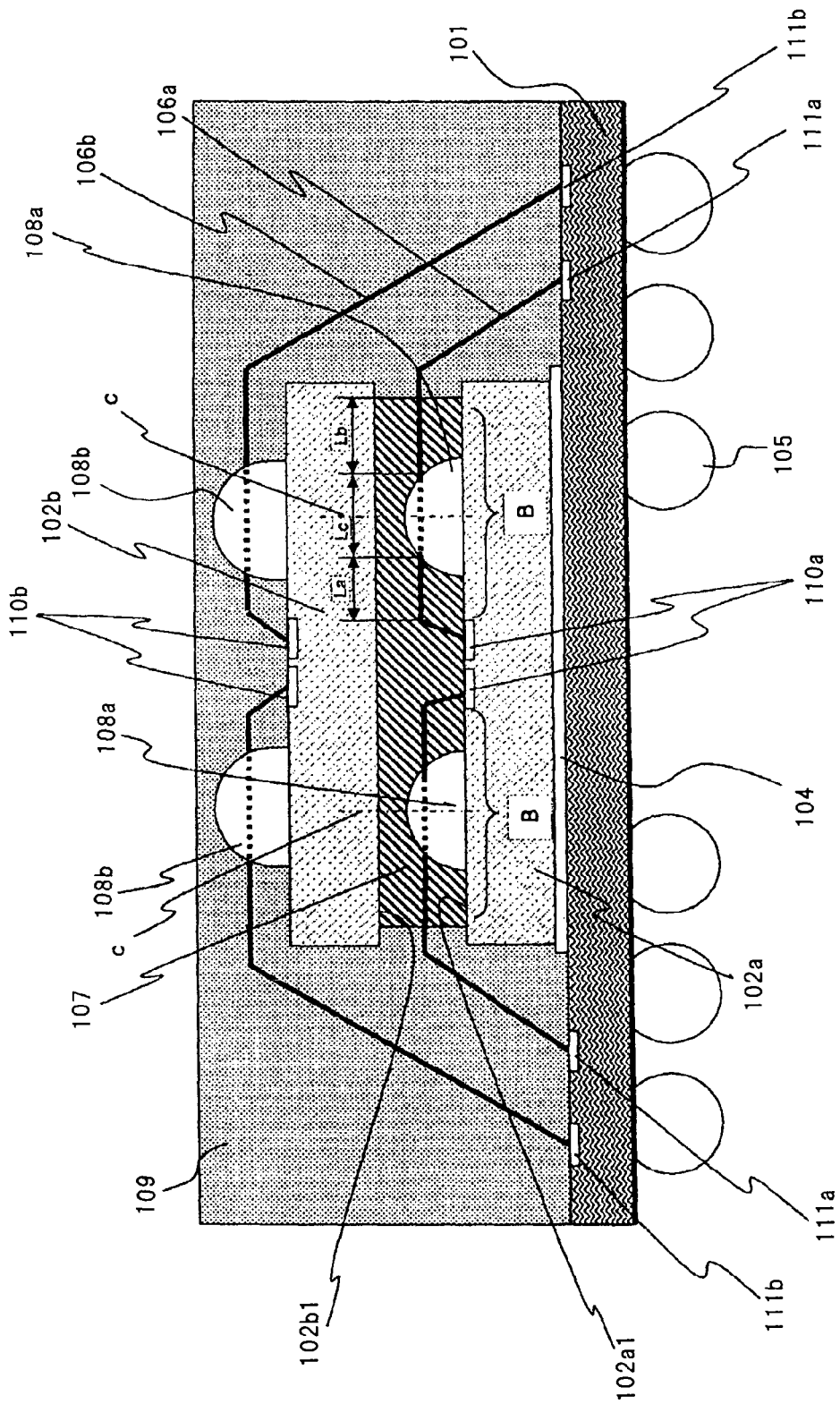
FIG. 4 is a schematic side sectional view of a semiconductor device in a second embodiment of the present invention.
Figure 5:
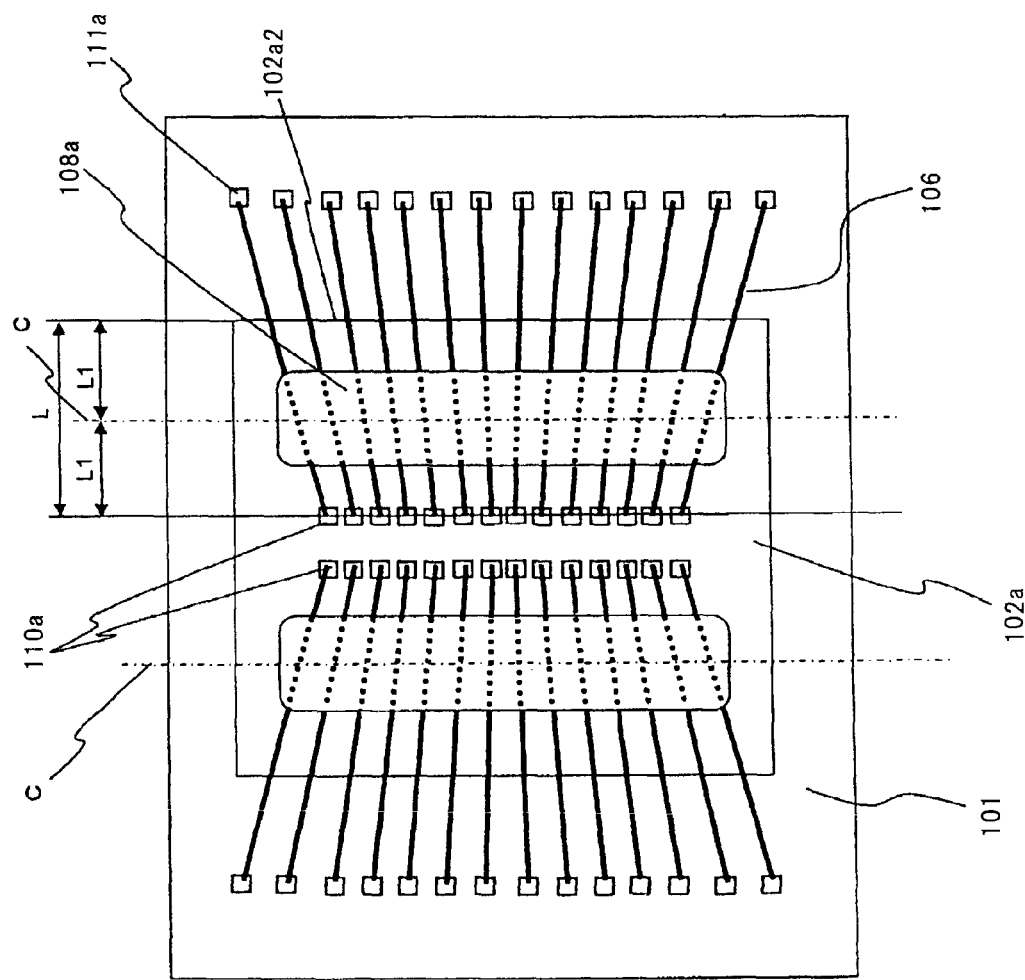
FIG. 5 is a plan view showing a state where the semiconductor chip on the upper layer side shown in FIG. 1 is removed.

FIGS. 4 and 5 show a second exemplary embodiment of the present invention. FIG. 5 is a plan view of a shape as seen in a state where a chip on the upper layer side is removed.

A semiconductor device in the present exemplary embodiment has wiring substrate 101, first semiconductor chip 102a and second semiconductor chip 102b. First semiconductor chip 102a is mounted by being stacked on wiring substrate 101, and second semiconductor chip 102b is mounted by being stacked on first semiconductor chip 102a. First semiconductor chip 102a is joined onto wiring substrate 101 with die bonding material 104. Second semiconductor chip 102b is joined onto first semiconductor chip 102a with die attach film (DAF) 107.

First semiconductor chip 102a and second semiconductor chip 102b stacked on wiring substrate 101 and first bonding wires 106a and second bonding wires 106b described below are encapsulated in mold resin 109. The maximum diameter of a filler contained in mold resin 109 may be, for example, 70 μm.

A plurality of first connection terminals 111a are arranged in a straight line in an upper surface of wiring substrate 101. A plurality of rows of terminals formed of a plurality of first connection terminals 111a are formed on wiring substrate 101. In the example shown in FIG. 5, two rows of terminals are respectively formed on two side portions of wiring substrate 101. The arrangement may alternatively be such that a plurality of rows of terminals is formed on one side portion of wiring substrate 101.

A plurality of second connection terminals 111b are arranged in straight lines in the upper surface of wiring substrate 101 outside the rows of first connection terminals 111a. A plurality of rows of terminals formed of second connection terminals 111b may be formed like the rows of terminals that are formed of first connection terminals 111a.

A plurality of solder balls 105 are provided in the lower surface of wiring substrate 1.

A plurality of first bonding pads 110a are arranged in a straight line in a central region of upper surface 102a1 of first semiconductor chip 102a. Such a pad arrangement is frequently seen in semiconductor chips such as DRAM chips. A plurality of rows of pads formed of a plurality of first bonding pads 110a may be formed. The rows of pads may be provided in staggered form. Upper surface 102a1 is the front surface of the semiconductor chip in which a circuit is formed.

First bonding wires 106a connect first bonding pads 110a and first connection terminals 111a to each other. First bonding wires 106a are connected to first bonding pads 110a by passing through the space between upper surface 102a1 of first semiconductor chip 102a and lower surface 102b1 of second semiconductor chip 102b. Lower surface 102b1 is the back surface positioned opposite from the front surface of the semiconductor chip. In the following description, portions of first bonding wires 106a passed through the space between upper surface 102a1 of first semiconductor chip 102a and lower surface 102b1 of second semiconductor chip 102b are referred to as "section B" as occasion demands.

First wire retaining members 108a formed of a coating material are provided in regions on upper surface 102a1 of first semiconductor chip 102a each including center line C bisecting distance L between the center of first bonding pad 110a and end 2a2 of first semiconductor chip 102a. As the coating material, an insulating resin paste material containing a filler whose maximum diameter is 50 μm can be used. Each first wire retaining member 108a is formed so as to extend along the longitudinal direction of the pad row of first bonding pads 110a. The material of first wire retaining members 108a is applied in a molten state from above first bonding wires 106a after first bonding pads 110a and first connection terminals 111a have been connected by first bonding wires 106a. The material of the first wire retaining members 108a is set after being applied. Sections B of first bonding wires 106a are thereby fixed and retained, with their portions (portions indicated by Lc in FIG. 4) embedded in first wire retaining members 108a. Each of first wire retaining member 108s is formed so as to extend along the longitudinal direction of the pad row of first bonding pads 110a, as described above. Thus, first wire retaining member 108a fixes and retains the plurality of first bonding wires 106a connected to these first bonding pads 110a.

A plurality of second bonding pars 110b and second wire retaining members 108b are also provided on an upper surface of second semiconductor chip 102a. The plurality of second bonding pads 110b are arranged in a straight line. A plurality of rows of pads formed of second bonding pads 110b may be formed. The rows of these pads may be provided in staggered form. Second bonding wires 106b connect second bonding pads 110b and second connection terminals 111b to each other. The material of second wire retaining members 108b is applied in a molten state from above second bonding wires 106b after second bonding pads 110b and second connection terminals 111b have been connected by second bonding wires 106b. The material of the second wire retaining members 108b is set after being applied. Second bonding wires 106b are thereby fixed and retained, with their portions embedded in second wire retaining members 108b.

First wire retaining member 108a in the present exemplary embodiment is not one-sidedly disposed closer to an end of the semiconductor chip but is disposed in the region including the center line C. That is, first wire retaining member 108a is disposed at a substantially middle position between first bonding pads 110a and end 102a2 of first semiconductor chip 102a, at which the displacement of sections B of first bonding wires 106a caused by an external force is maximized. Thus, the deformation of first bonding wires 106a in sections B when an external force is applied can be reduced.

Central portions of first bonding wires 106a in sections B are retained with first wire retaining members 108a, as described above, thus enabling effective limiting of the deformation of first bonding wires 106a at the time of mold encapsulation in comparison with the insulating supporting structure in Japanese Patent Laid-Open No. 2004-312008 one-sidedly disposed closer to a semiconductor chip.

Let the length of the bonding wires extending from first wire retaining member 108a to the first bonding pad 110a side be wire length La. Let the length of the bonding wires extending from first wire retaining member 108a to the first connection terminal 111a side be wire length Lb. Further, let the length of first bonding wires 106a retained by first wire retaining member 108a be wire length Lc. At this time, wire length Lc may be set so as to satisfy the relationship: Lc>(La+Lb+Lc)/2. That is, a portion of each first bonding wire 106a in section B having a length equal to or larger than half the length of section B may be retained by first wire retaining member 108a.

First bonding wires 106a are retained by first wire retaining members 108a as described above to enable first bonding wires 106a to be positioned generally at the center of the spacing between semiconductor chips 102a and 102b even in a case where sections B of first bonding wires 106a receive an external force at the time of encapsulation. That is, when the chip periphery is encapsulated with mold resin 109, external force is applied to first bonding wire 106a. Even in such an event, the present exemplary embodiment enables preventing the distances between first bonding wires 106a, semiconductor chips 102a and 102b from being changed before and after the encapsulation process.

Thus, according to the present exemplary embodiment, it is possible to prevent an increase in parasitic capacitance between first bonding wires 106a and first semiconductor chips 102a that is caused by bringing first bonding wires 106a closer to first semiconductor chip 102a. That is, sections B of first bonding wires 106a are placed at a particular height between the semiconductor chips by first wire retaining members 108a and, therefore, a stable parasitic capacitance is produced by bonding wire 106 between bonding wires 106a and semiconductor chip 102a. Consequently, a product free from signal degradation at wire bonding portions can be obtained.

Figure 6:
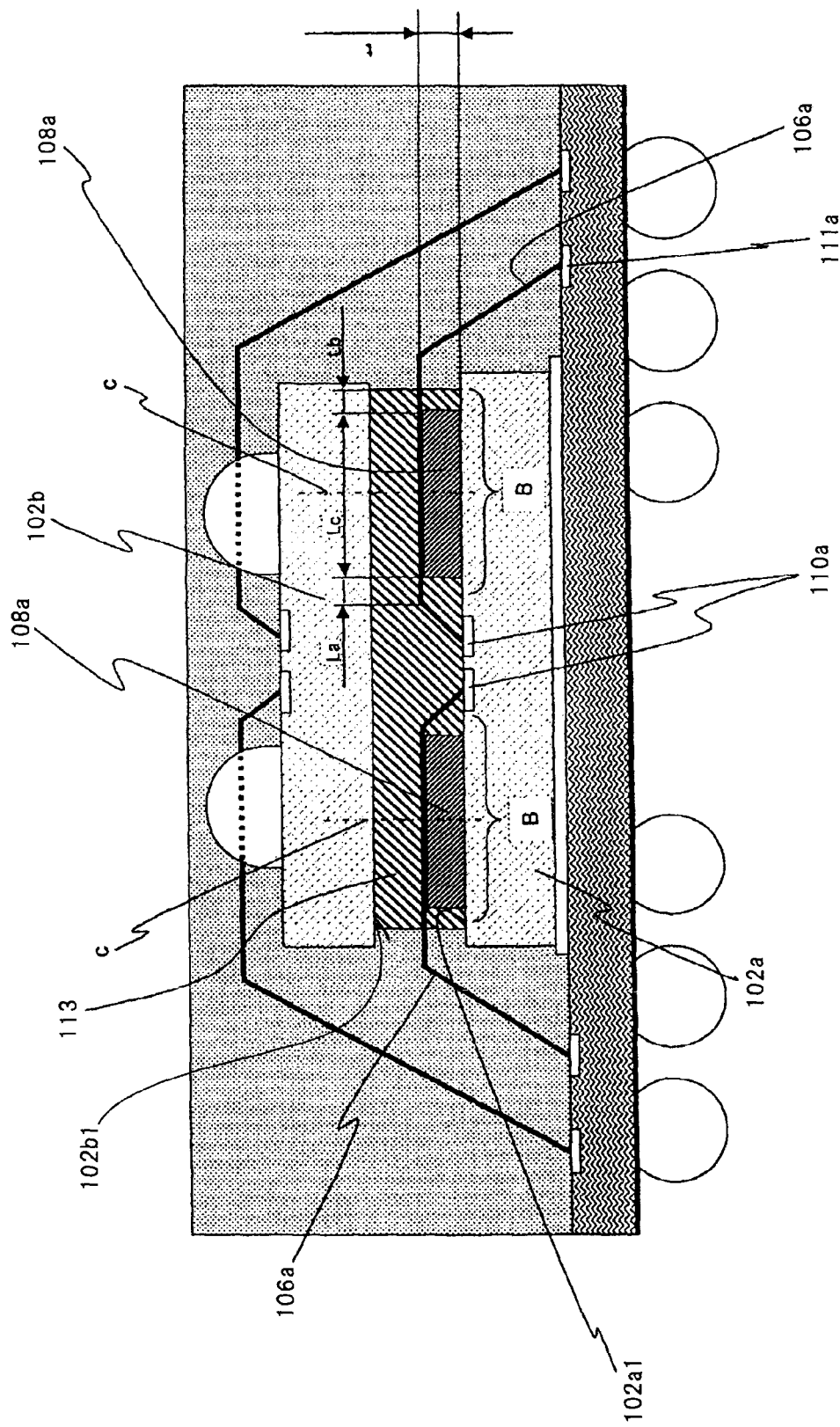
FIG. 6 is a schematic side sectional view of a semiconductor device in a third embodiment of the present invention.

FIG. 6 shows a side sectional view of a semiconductor device according to a third embodiment of the present invention. A large difference of this semiconductor device from that shown FIG. 4 resides in that no DAF is provided on the back surface of a chip on the upper layer side. Die attach paste 113 is used for joining chips to each other. Components identical to those of the exemplary embodiment shown in FIG. 4 will be described by using the same reference characters.

In the present exemplary embodiment, first wire retaining members 108a formed of die attach film having thickness t are provided on upper surface 102a1 of first semiconductor chip 102a. First bonding wires 106a are connected after the die attach film has been placed on upper surface 102a1 of first semiconductor chip 102a. First bonding wires 106a on first wire retaining members 108a are fixed and retained on first wire retaining members 108a by temporarily melting first wire retaining members 108a in the form of a die attach film and by thereafter setting the molten film. Thus, the die attach film is placed between upper surface 102a1 of first semiconductor chip 102a and first bonding wires 106a, heated and molten and thereafter set.

The same point as that in the exemplary embodiment shown in FIG. 4 will be discussed. Let the length of the bonding wires extending from first wire retaining member 108a to the first bonding pad 110a side be wire length La. Let the length of the bonding wires extending from first wire retaining member 108a to the first connection terminal 111a side be wire length Lb. Further, let the length of first bonding wires 106a retained by first wire retaining member 108a be wire length Lc. At this time, wire length Lc satisfies the relationship: Lc>(La+Lb+Lc)/2. That is, a portion of each first bonding wire 106a in section B having a length equal to or larger than half the length of section B is retained by first wire retaining member 108a. Thus, in the present exemplary embodiment in which first wire retaining members 108a are formed of die attach film, a construction for retaining first bonding wires 106a in a wide region can be easily realized.

Further, first bonding wires 106a are fixed on first wire retaining members 108a having thickness t, and the thickness of die attach paste 113 on first wire retaining members 108a is also set to t. In sections B, therefore, first bonding wires 106a are positioned generally at the center of the spacing between upper surface 102a1 of semiconductor chip 102a and the back surface of semiconductor chip 102b.

Consequently, the present exemplary embodiment has the same advantages as the exemplary embodiment shown in FIG. 4. That is, it is possible to prevent an increase in parasitic capacitance between first bonding wires 106a and first semiconductor chips 102a that is caused by bringing first bonding wires 106a closer to first semiconductor chip 102a. The region in which sections B of bonding wires 106a that are positioned between the semiconductor chips can be placed at a particular height can be increased in comparison with the exemplary embodiment shown in FIG. 4. Therefore stabilization of the parasitic capacitance can be improved. Consequently, a further improvement in signal characteristics can be achieved in comparison with the exemplary embodiment shown in FIG. 4.

Figure 7:
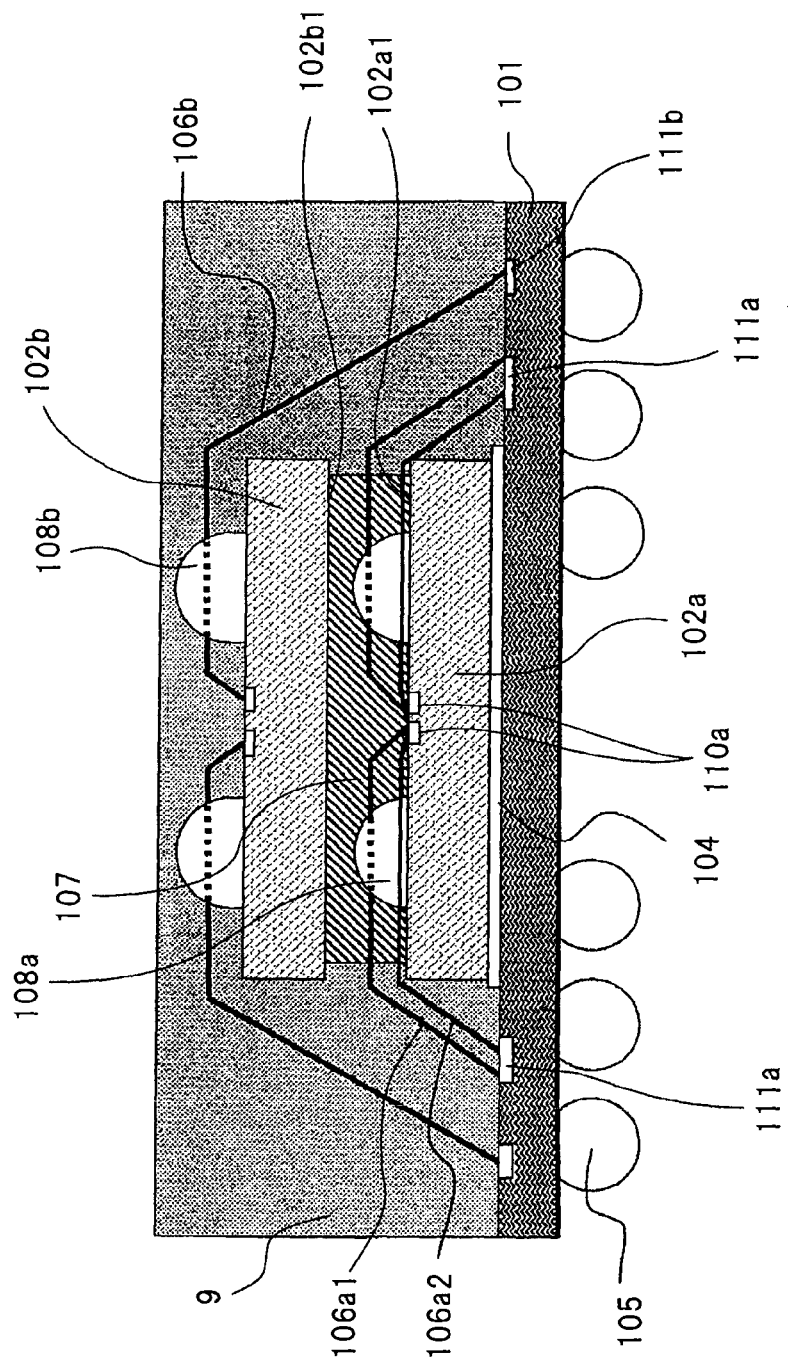
FIG. 7 is a schematic side sectional view of a semiconductor device in still another embodiment of the present invention.
Figure 8:
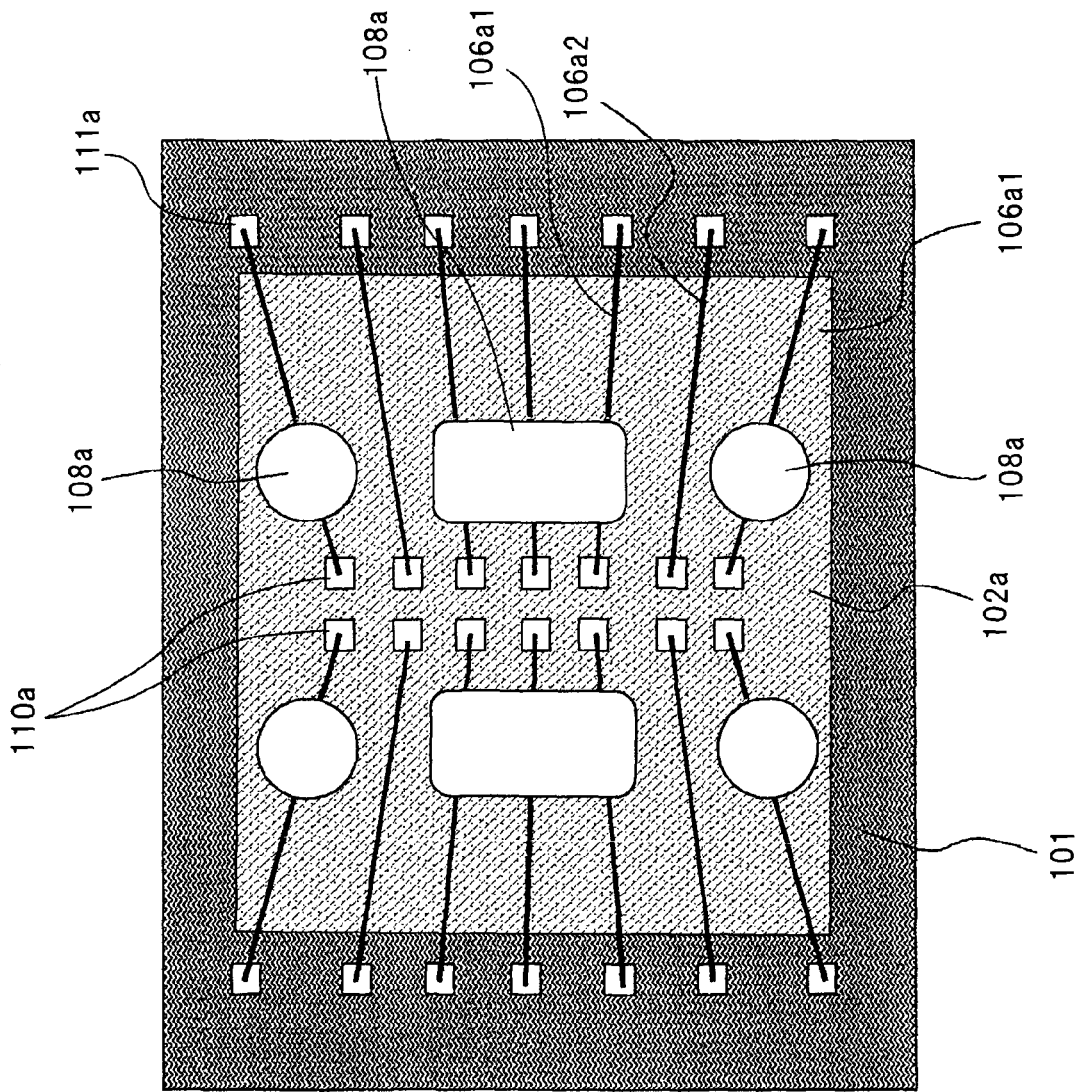
FIG. 8 is a plan view of the first semiconductor chip in the semiconductor device shown in FIG. 7.
Figure 9:
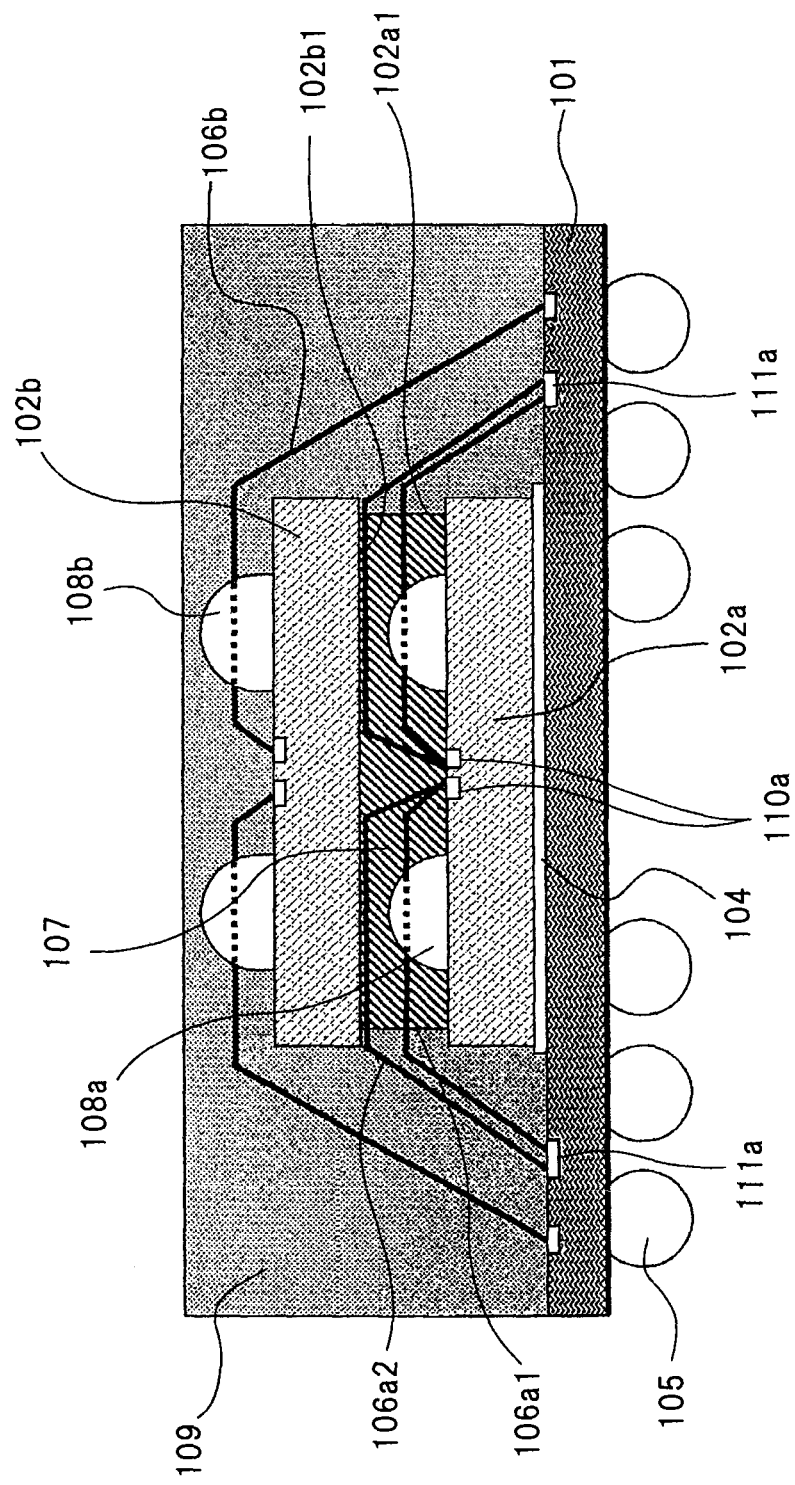
FIG. 9 is a side sectional view of a modified example of the semiconductor device in still another embodiment of the present invention.

FIG. 7 shows a side sectional view of a semiconductor device according to still another embodiment of the present invention. FIG. 8 shows a plan view of a first semiconductor chip in the semiconductor device shown in FIG. 7. FIG. 9 shows a side sectional view of a modified example of the semiconductor device in the present exemplary embodiment.

In the exemplary embodiments described above, all of bonding wires 106a between semiconductor chips are placed at a predetermined height by retaining members. The present exemplary embodiment differs from those described above in that bonding wires 106a are placed at respective optimum positions between semiconductor chips according to the kinds of external pins electrically connected to bonding wires 106a (e.g., those for a power supply system, a GND system and a signal system). In other respects, the construction is the same as that in the exemplary embodiment shown in FIG. 4. The same description of the construction will not be repeated. Also, the same components as those in the exemplary embodiment shown in FIG. 4 will be described by using the same reference characters.

In the present exemplary embodiment, only signal-system wires 106a1 in a plurality of bonding wires 106a passed through the space between upper surface 102a1 of first semiconductor chip 102a and lower surface 102b1 of second semiconductor chip 102b are placed at a substantially middle position between the upper and lower chips by first wire retaining members 108a. First wire retaining members 108a are disposed only in places through which signal-system wires 106a1 are passed. Signal-system wires 106a1 are passed through a position at which the parasitic capacitance is minimized with respect to each of first semiconductor chip 102a and second semiconductor chip 102b (that is, a position substantially coinciding with the center between the two chips). Therefore signal quality at the signal-system wire portions is improved. While a paste resin material is used for first wire retaining members 108a in the present exemplary embodiment, die attach film can be used in place of the paste resin material. If wire retaining members 108a in the form of a die attach film are used, as in the case of the exemplary embodiment shown in FIG. 6, signal-system wires 106a1 can be easily placed in a wide area at a substantially middle position between the upper and lower chips.

On the other hand, power-system wires or GND-system wires (hereinafter referred to as power supply GND system wires 106a2) in the above-described plurality of bonding wires 106a are placed so as to lie in close vicinity to upper surface 102a1 of first semiconductor chip 102a. However, power supply GND system wires 106a2 are not in electrical contact with upper surface 102a1. By placing power supply GND system wires 106a2 in this way, the parasitic capacitance between power supply GND system wires 106a2 and first semiconductor chip 102a can be increased to improve electrical characteristics of the power supply GND system. Also in a case where power supply GND system wires 106a2 are placed so as to lie in close vicinity to lower surface 102b1 of second semiconductor chip 102b, as shown in FIG. 9, the effect of improving electrical characteristics of the power supply GND system, as in the case of placement of power supply GND system wires 106a2 shown in FIG. 7, can also be obtained. Wire retaining members formed of a coating material or a die attach film, as in the above-described embodiments, may be used for the purpose of placing power supply GND system wires 106a2 in close vicinity to upper surface 102a1 of first semiconductor chip 2a or in close vicinity to lower surface 102b1 of second semiconductor chip 102b.

While exemplary embodiments of the present invention have been described with reference to the drawings, the present invention is not limited to the illustrated structure and form; the present invention can be implemented by suitably changing or combining the above-described exemplary embodiments without departing from the technical spirit of the present invention. For example, the present invention can be applied in a similar manner even to a case where three or more semiconductor chips are stacked.

Although the inventions has been described above in connection with several preferred embodiments thereof, it will be appreciated by those skilled in the art that those embodiments are provided solely for illustrating the invention, and should not be relied upon to construe the appended claims in a limiting sense.

What is claimed is:

1. A semiconductor device comprising:
   a substrate having a plurality of electrodes on its one surface;
   a first semiconductor chip having its back surface joined to the one surface of the substrate and having a plurality of bonding pads in a central region of its front surface;
   a plurality of wires which connect the electrodes of the substrate and the bonding pads of the first semiconductor chip to each other;
   a second semiconductor chip disposed so that its back surface is positioned on the front surface of the first semiconductor chip with a bonding layer interposed between the first and second semiconductor chips; and
   a wire retaining member which is disposed in a region of the front surface of the first semiconductor chip including a middle point, the middle point being midway between the bonding pads and a peripheral edge of the first semiconductor chip, and which retains, at a position of a center of a spacing between the first semiconductor chip and the second semiconductor chip, at least a portion of each of a subset of the plurality of wires passing through a space between the first semiconductor chip and the second semiconductor chip.

2. The semiconductor device according to claim 1, wherein the subset of the wires retained by the wire retaining member is wires used as signal-system wires.

3. The semiconductor device according to claim 2, wherein the wires used as power supply GND wires in the plurality of bonding wires passing through the space between the first semiconductor chip and the second semiconductor chip are placed so as to lie in close vicinity to the front surface of the first semiconductor chip or in close vicinity to the back surface of the second semiconductor chip.

4. The semiconductor device according to claim 1, wherein a half or more of a wiring length of each of the wires positioned between the first semiconductor chip and the second semiconductor chip is retained by the wire retaining member.

5. The semiconductor device according to claim 1, wherein, with respect to portions of the wires positioned between the first semiconductor chip and the second semiconductor chip, both of a wire length of the wires extending from the wire retaining member to the bonding pads and the wire length of the wires extending from the wire retaining member to the peripheral edge is shorter than the wiring length of the wires retained by the wire retaining member.

6. The semiconductor device according to claim 1, wherein the plurality of bonding pads are arranged in a straight line on the front surface of the first semiconductor chip, and the wire retaining member is provided along the longitudinal direction of a row of the plurality of bonding pads.

7. The semiconductor device according to claim 1, wherein the wire retaining member is formed of an insulating resin of a different material from a material of the bonding layer.

8. A semiconductor device comprising:
a first semiconductor chip having a plurality of bonding pads in a central region of the first semiconductor chip;
a second semiconductor chip stacked over the first semiconductor chip;
a plurality of wires bonded respectively to the plurality of bonding pads of the first semiconductor chip, each of the wires passing through a space between the first and second semiconductor chips and leading out beyond a peripheral edge of the first semiconductor chip; and
a retaining member retaining at least a subset of the wires such that a portion of each wire of the subset of the wires passing over an intermediate point midway between an associated one of the bonding pads and the peripheral edge of the first semiconductor chip, is positioned substantially at a center of the space between the first and second semiconductor chips, wherein the retaining member is positioned in a region including the intermediate point.

9. The device according to claim 8, further comprising an adhesive layer intervening the first and second semiconductor chips, the adhesive layer being different in material from the retaining member.

10. The device as claimed in claim 9, wherein the subset of the wires is partially embedded into the retaining member.

11. The device according to claim 8, wherein the wires comprise at least one first wire for conveying a power supply voltage and at least one second wire for conveying a signal, and the subset of the wires comprises the second wire.

12. The device according to claim 8, wherein the retaining member comprises a resin tape.

13. The device according to claim 8, wherein the second semiconductor chip comprises a plurality of bonding pads, and the device further comprises a plurality of additional wires bonded respectively to the plurality of bonding pads of the second semiconductor chip, each of the additional wires passing over the second semiconductor chip and leading out beyond a peripheral edge of the second semiconductor chip.

14. A semiconductor device comprising:
a substrate including first and second electrodes thereon;
a first semiconductor chip including a first bonding pad on one surface, the first semiconductor chip mounted over the substrate so that the other surface of the first semiconductor chip faces the substrate;
a first wire electrically coupling the first electrode to the first bonding pad;
a first retaining member provided between the first semiconductor chip and the first wire, the first retaining member being disposed between the first electrode and the first bonding pad in plan view;
a second semiconductor chip including a second bonding pad on one surface, the second semiconductor chip stacked over the first semiconductor chip so that the other surface of the second semiconductor chip faces the first semiconductor chip;
a second wire electrically coupling the second electrode to the second bonding pad;
a second retaining member provided on the one surface of the second semiconductor chip, a part of the second wire being embedded in the second retaining member, wherein the first retaining member is constructed with a resin tape, and the second retaining member is constructed with a resin paste; and
a mold resin provided over the substrate to cover the first semiconductor chip, the second semiconductor chip, the first wire and the second wire and the second retaining member, the mold resin is constructed with a material differing from the second retaining member.

15. The semiconductor device according to claim 14, further comprising:
an adhesive member is provided between the first semiconductor chip and the second semiconductor chip, a part of the first wire being disposed between the first retaining member and the adhesive member.

16. The semiconductor device according to claim 15, further comprising:
a die attach film is provided between the adhesive member and the second semiconductor chip.

17. The semiconductor device according to claim 14, wherein the first bonding pad is positioned in a central region of the one surface of the first semiconductor chip, and
the first retaining member is positioned in a region including a middle point, the middle point being midway between the first bonding pad and a peripheral edge of the first semiconductor chip.

18. The semiconductor device according to claim 17, wherein a part of the first wire is positioned substantially at a center of a space between the first semiconductor chip and the second semiconductor chip.

19. The semiconductor device according to claim 14, wherein the second semiconductor chip is farthest semiconductor chip from the substrate.

* * * * *